United States Patent

US 7,859,296 B2
Dec. 28, 2010

Kim et al.

(12) United States Patent
(10) Patent No.: US 7,859,296 B2
(45) Date of Patent: Dec. 28, 2010

(54) CALIBRATION CIRCUIT, ON DIE TERMINATION DEVICE AND SEMICONDUCTOR MEMORY DEVICE USING THE SAME

(75) Inventors: Mi-Hye Kim, Gyeonggi-do (KR); Seok-Bo Shim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/326,772

(22) Filed: Dec. 2, 2008

(65) Prior Publication Data

US 2010/0060316 A1 Mar. 11, 2010

(30) Foreign Application Priority Data

Sep. 5, 2008 (KR) ...................... 10-2008-0087520

(51) Int. Cl.
*H03K 17/16* (2006.01)
*H03K 19/003* (2006.01)
(52) U.S. Cl. .......................................... 326/30; 326/80
(58) Field of Classification Search .................... 326/30, 326/86, 80
See application file for complete search history.

(56) References Cited

U.S. PATENT DOCUMENTS

| 5,406,221 | A  | * | 4/1995  | Samani et al. ............... 330/254 |
| 6,356,105 | B1 | * | 3/2002  | Volk ............................. 326/30 |
| 6,603,416 | B2 | * | 8/2003  | Masenas et al. ............. 341/120 |
| 6,833,729 | B2 | * | 12/2004 | Kim et al. ...................... 326/30 |
| 6,980,020 | B2 | * | 12/2005 | Best et al. ..................... 326/30 |
| 7,176,711 | B2 | * | 2/2007  | Park et al. ..................... 326/30 |
| 7,301,366 | B1 | * | 11/2007 | Devnath et al. ................ 326/30 |
| 2008/0012634 | A1 | * | 1/2008 | Oyang et al. ................... 330/9 |
| 2009/0146683 | A1 | * | 6/2009 | Kim ............................. 326/30 |

FOREIGN PATENT DOCUMENTS

| KR | 102007011636 A | 12/2007 |
| KR | 102008009250 A | 10/2008 |

OTHER PUBLICATIONS

Notice of Preliminary Rejection issued from Korean Intellectual Property Office on Sep. 29, 2009 with an English Translation.
Notice of Allowance issued from Korean Intellectual Property Office on Dec. 28, 2009.

* cited by examiner

*Primary Examiner*—Vibol Tan
*Assistant Examiner*—Crystal L Hammond
(74) *Attorney, Agent, or Firm*—IP & T Group LLP (57) ABSTRACT

A calibration circuit includes a gain control device configured to adjust a reference voltage to a predetermined level according to a variable gain; and a calibration device configured to update a calibration code by comparing a voltage generated by resistors and the reference voltage adjusted to the predetermined level by the gain control device, wherein the resistors are individually controlled to be turned on by the calibration code.

26 Claims, 10 Drawing Sheets

CALIBRATION CIRCUIT, ON DIE TERMINATION DEVICE AND SEMICONDUCTOR MEMORY DEVICE USING THE SAME

CROSS-REFERENCE TO RELATED APPLICATION

The present invention claims priority of Korean patent application number 10-2008-0087520, filed on Sep. 5, 2008, which is incorporated by reference in its entirety.

BACKGROUND OF THE INVENTION

The present invention relates to a calibration circuit, an on die termination device and a semiconductor memory device using the same, and more particularly, to a calibration circuit for trimming a calibration code, an on die termination device and a semiconductor memory device using the same.

Various semiconductor devices embodied by using an integrated circuit chip such as a central processing unit (CPU), a memory device and a gate array are employed in various electronic devices such as a personal computer (PC), a server and a workstation. In most cases, the semiconductor device includes a receiving circuit for receiving various signals transmitted from the outside through an input pad and an output circuit for transferring an internal signal to the outside through an output pad.

As the operating speed of an electronic device is increased, the delay time generated during a signal transmission process needs to be minimized by decreasing the swing width of a signal transferred between semiconductor devices. However, as the swing width of a signal is decreased, the influence of noise is increased and a signal reflection due to an impedance mismatch of interfaces between the semiconductor devices is increased.

The impedance mismatch is generated due to external noise, a power supply voltage variation, an operating temperature variation or a manufacturing process variation. Due to the impedance mismatch, it is difficult to transfer data at a high speed, and the data can be distorted. Therefore, when a receiving device receives the distorted output data, problems such as a setup/hold failure, an input level misjudgment or the like may occur.

Therefore, for solving the above-mentioned problems, the memory device required for a high speed operation employs an impedance matching circuit, called an on die termination, near a pad in a chip. Generally, in an on die termination scheme, a transmission device performs a source termination through an output circuit and a receiving device performs a parallel termination through a termination circuit connected in parallel to a receiving circuit coupled to the input pad.

A ZQ calibration is a process performed at a ZQ node for a calibration. The ZQ calibration process is performed for generating a pull-up calibration code (PCODE) and a pull-down calibration code (NCODE) which vary according to a PVT (Process, Voltage and Temperature) condition. By using the codes generated according to the ZQ calibration, a resistance of the on die termination device and a termination resistance of a DQ pad in case of a semiconductor memory device are adjusted.

Figure 1:
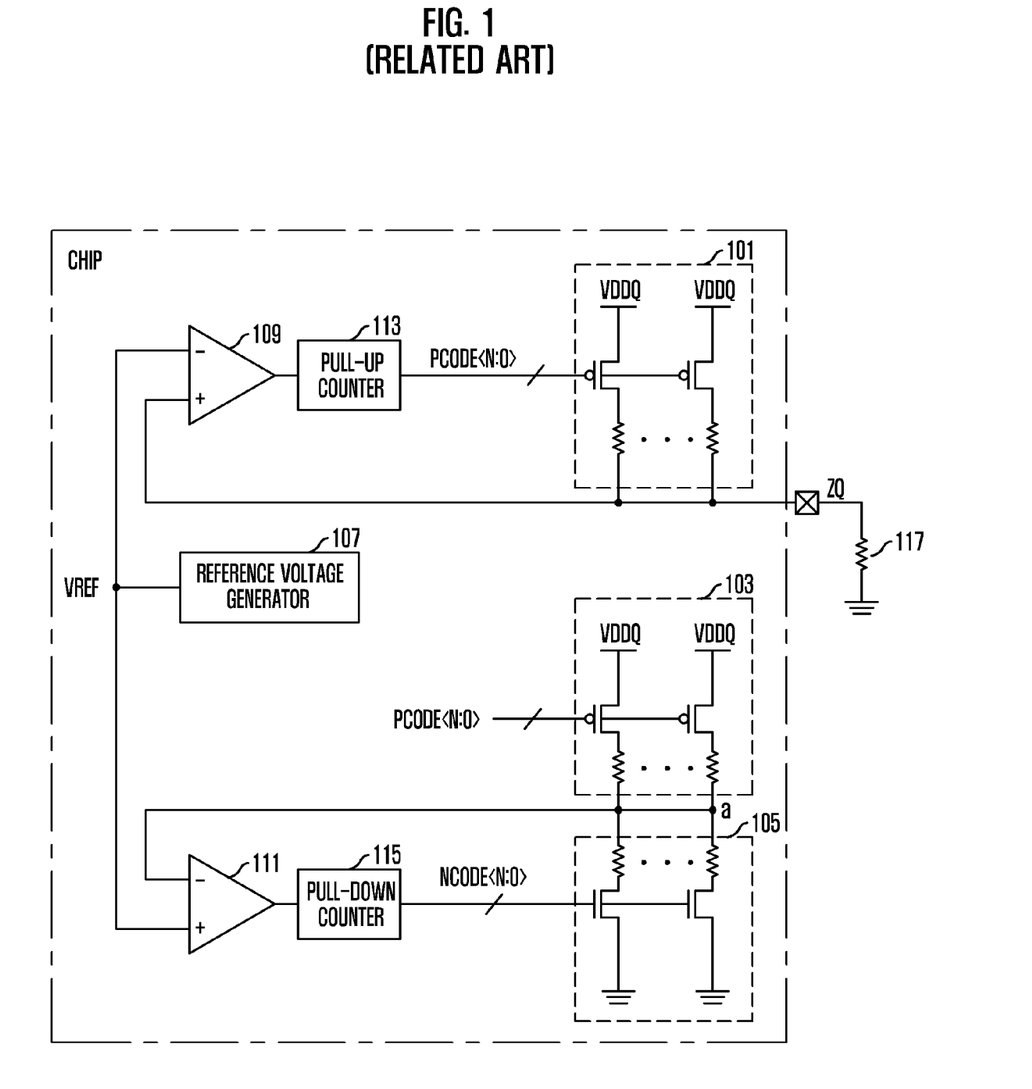
FIG. 1 is a schematic circuit diagram showing a conventional ZQ calibration circuit included in an on die termination device or a semiconductor memory device.

FIG. 1 is a schematic circuit diagram showing a conventional ZQ calibration circuit included in an on die termination device or a semiconductor memory device.

As shown, the conventional ZQ calibration circuit employed in the on die termination device or the semiconductor memory device includes a pull-up calibration resistance circuit 101; a dummy calibration resistance circuit 103; a pull-down calibration resistance circuit 105; a reference voltage generator 107; a first and a second comparators 109 and 111; a pull-up counter 113; and a pull-down counter 115.

The pull-up calibration resistance circuit 101 includes a plurality of pull-up resistors which are turned on/off according to a pull-up calibration code PCODE<N:0>. The pull-up calibration resistance circuit 101 is calibrated with an external resistor 117 coupled to a ZQ node in order to generate the pull-up calibration code PCODE<N:0>.

The first comparator 109 compares a voltage of the ZQ node (VZQ) connected to the external resistor 117 coupled to a ZQ pin and the pull-up calibration resistance circuit 101 with a reference voltage VREF generated by the reference voltage generator 107 in order to generate an up/down signal UP/DOWN. Herein, a voltage level of the reference voltage VREF is generally set to VDDQ/2.

The pull-up counter 113 generates the pull-up calibration code PCODE<N:0> based on the up/down signal UP/DOWN outputted from the first comparator 109. Then, a resistance of the pull-up calibration resistance circuit 101 is adjusted by turning on/off the resistors connected in parallel included in the pull-up calibration resistance circuit 101 according to the generated pull-up calibration code PCODE<N:0>. Thereafter, the adjusted resistance of the pull-up calibration resistance circuit 101 varies a voltage VZQ of the ZQ node again.

By repeatedly performing the above-mentioned process, a whole resistance of the pull-up calibration resistance circuit 101 is equalized to a resistance of the external resistor 117, thereby completing a pull-up calibration process. Herein, the resistance of the external resistor 117 is generally 240 ohms.

A circuit structure of the dummy calibration resistance circuit 103 is same to that of the pull-up calibration resistance circuit 101. The pull-down calibration resistance circuit 105 includes a plurality of pull-down resistors which are turned on/off according to a pull-down calibration code NCODE<N:0>. The dummy calibration resistance circuit 103 and the pull-down calibration resistance circuit 105 generate the pull-down calibration code NCODE<N:0> based on the pull-up calibration code PCODE<N:0> generated by the pull-up calibration resistance circuit 101.

The pull-up calibration code PCODE<N:0> generated by the pull-up calibration process is inputted to the dummy calibration resistance circuit 103 so that the whole resistance of the dummy calibration resistance circuit 103 is determined. Therefore, the dummy calibration resistance circuit 103 has the same resistance as the pull-up calibration resistance circuit 101.

Thereafter, a pull-down calibration process is performed. In a similar way to the pull-up calibration process, the voltage level of a pull-down calibration node a (VZQ_N) is adjusted to the voltage level of the reference voltage VREF, i.e., the pull-down calibration is performed so that the whole voltage level of the pull-down calibration resistance circuit 105 is equalized to that of the dummy calibration resistance circuit 103. Herein, the ZQ node voltage VZQ can be used as an input signal of the second comparator 111 instead of the reference voltage VREF generated by the reference voltage generator 107.

According to the pull-up and pull-down calibration codes PCODE<N:0> and NCODE<N:0> generated by the above-mentioned pull-up and pull-down calibration processes, the pull-up and pull-down termination resistances are determined. Therefore, the resistance of the on die termination device or the pull-up and pull-down termination resistances of a DQ pad included in the semiconductor memory device is determined. For instance, in case of the semiconductor memory device, the pull-up and pull-down resistances of the DQ pad have the same layout as the pull-up and pull-down calibration resistance circuits 101 and 105 shown in FIG. 1.

Figure 2:
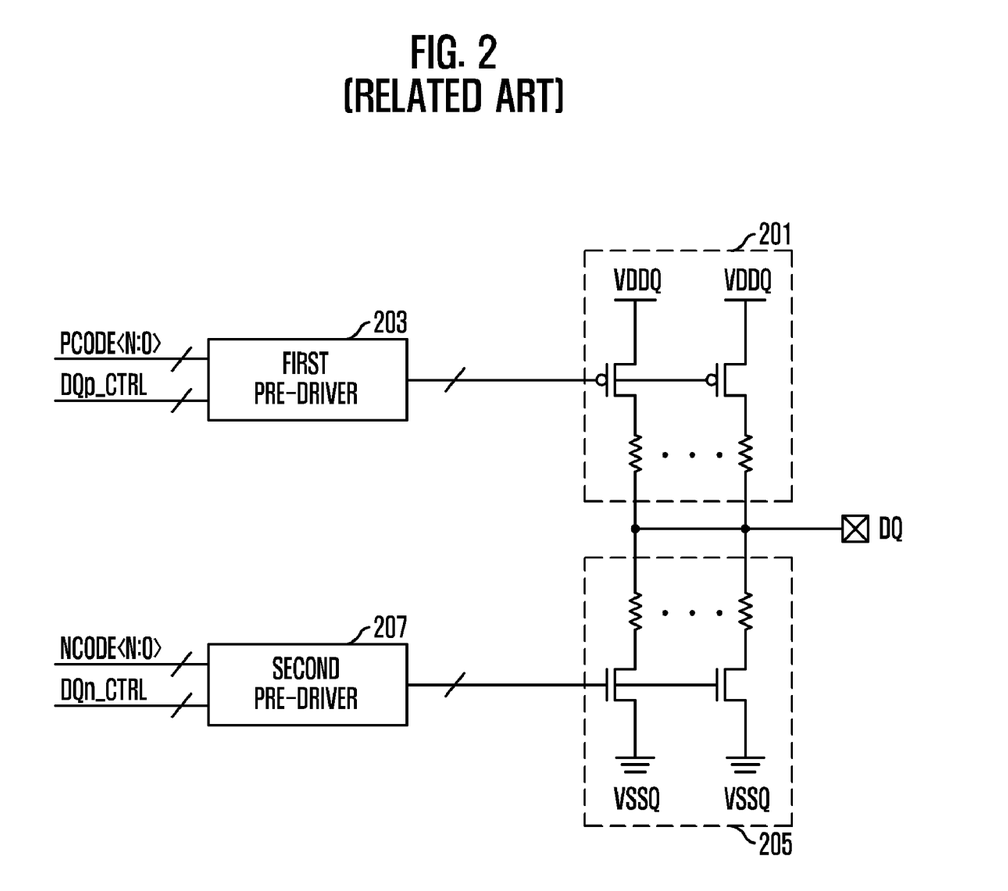
FIG. 2 is a schematic circuit diagram depicting a conventional pull-up and pull-down termination resistance circuit.

FIG. 2 is a schematic circuit diagram depicting a conventional pull-up and pull-down termination resistance circuit.

Referring to FIG. 2, for instance, in case of the semiconductor memory device, the pull-up and pull-down termination resistance circuit provided in an output driver of the DQ pad includes a pull-up termination resistance circuit 201 and a pull-down termination resistance circuit 205 for outputting data; and first and second pre-drivers 203 and 207 respectively connected to input terminals of the pull-up termination resistance circuit 201 and the pull-down termination resistance circuit 205.

In response to an output signal of the first pre-driver 203, the pull-up termination resistance circuit 201 is turned on so that the voltage level of a DQ pin is kept as a high level. Similarly, according to an output signal of the second pre-driver 207, the pull-down termination resistance circuit 205 is turned on so that the voltage level of the DQ pin is kept as a low level. In other words, a high level data or a low level data is outputted according to the pull-up termination or the pull-down termination.

Herein, the number of turned-on resistors of the pull-up termination resistance circuit 201 and the number of turned on resistors of the pull-down termination resistance circuit 205 are respectively determined based on code values of the PCODE<N:0> and the NCODE<N:0>. That is, whether the pull-up and the pull-down termination resistance circuits 201 and 205 are turned on or not is determined according to logic states of the PCODE<N:0> and the NCODE<N:0> outputted from the first and the second pre-drivers 203 and 207, however, each individual resistor included in the pull-up and the pull-down termination resistance circuits 201 and 205 is turned on or off according to code values of the PCODE<N: 0> and the NCODE<N:0>.

DQp_CTRL and DQn_CTRL respectively inputted to the first and the second pre-drivers 203 and 207 are various control signals.

Figure 3:
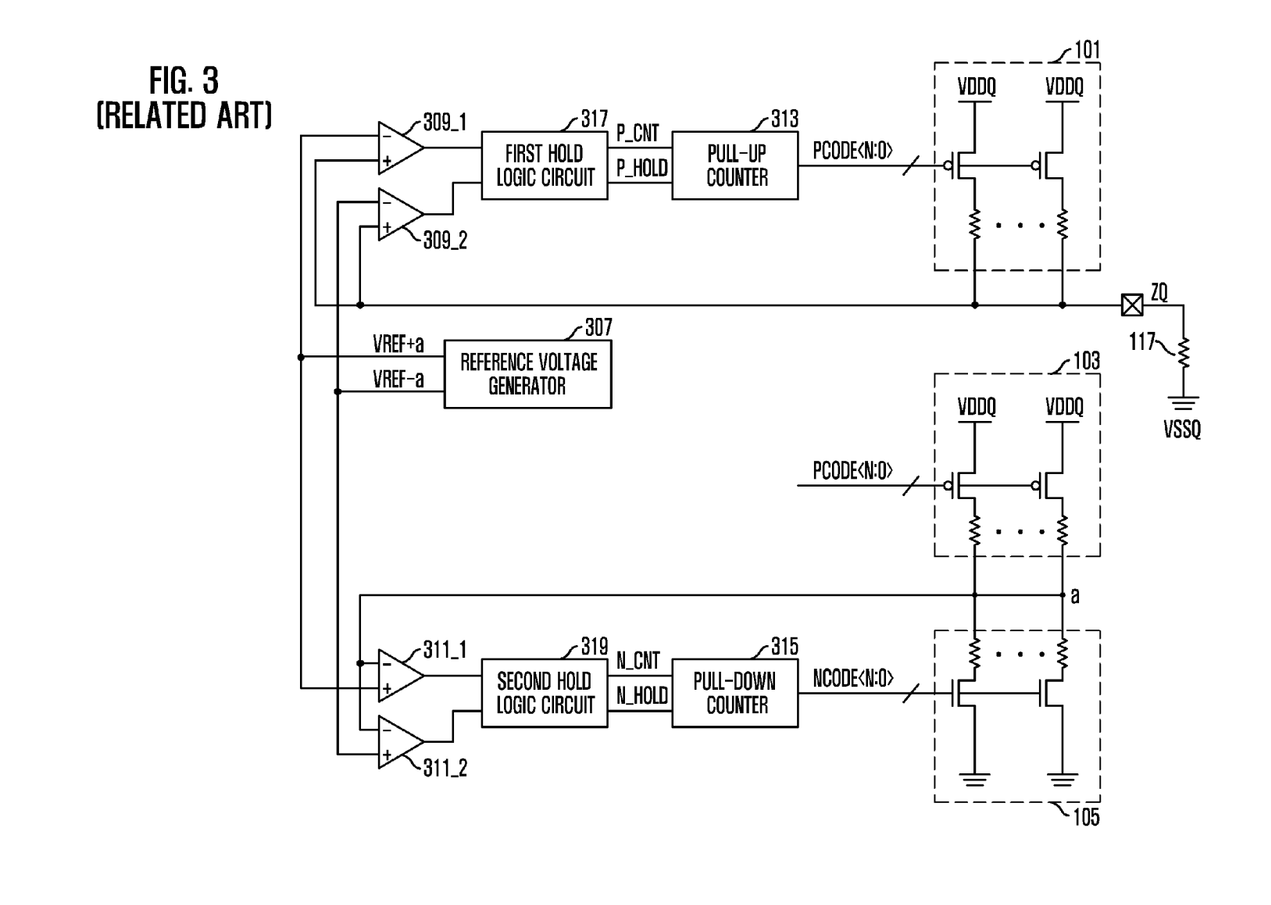
FIG. 3 is a schematic circuit diagram illustrating another conventional ZQ calibration circuit included in the on die termination device or the semiconductor memory device.

FIG. 3 is a schematic circuit diagram illustrating another conventional ZQ calibration circuit included in the on die termination device or the semiconductor memory device.

Referring to FIG. 3, unlike the circuit shown in FIG. 1, a reference voltage generator 307 generates a first reference voltage VREF+a and a second reference voltage VREF−a having a predetermined error tolerance from a reference voltage VREF. Further, first to fourth comparators 309_1, 309_2, 311_1 and 311_2; and first and second hold logic circuits 317 and 319 are included.

The first and the second comparators 309_1 and 309_2 of a pull-up calibration resistance circuit 101 compare the voltage level of a ZQ node (VZQ) with the first and the second reference voltages VREF+a and VREF−a. When outputs of the first and the second comparators 309_1 and 309_2 are different from each other, the voltage level of the ZQ node voltage VZQ is between the first and the second reference voltages VREF+a and VREF−a. At this time, the first hold logic circuit 317, for instance, generates a high-enabled hold signal P_HOLD in order to fix the PCODE by disabling a first counter 313.

The voltage gap between the first and the second reference voltages VREF+a and VREF−a is called a target range. Meanwhile, when the outputs of the first and the second comparators 309_1 and 309_2 are equal, the ZQ node voltage VZQ is higher than the first reference voltage VREF+a or lower than the second reference voltage VREF−a. In this case, the first hold logic circuit 317 inactivates the hold signal P_HOLD and transfers one of output signals (P_CNT) of the first and the second comparators 309_1 and 309_2. Then, the first counter 313 generates the PCODE based on the output signal P_CNT outputted from the first hold logic circuit 317.

A dummy calibration resistance circuit 103 and a pull-down calibration resistance circuit 105 perform the calibration operation in a similar way to the above-mentioned processes shown in FIG. 1.

Herein, the constructions 311_1, 311_2, 319 and 315 for the pull-down calibration shown in FIG. 3 can be replaced with the constructions 111 and 115 for the pull-down calibration shown in FIG. 1. In this case, the ZQ node voltage VZQ instead of the reference voltage VREF can be used as an input signal of the comparator 111.

Figure 4:
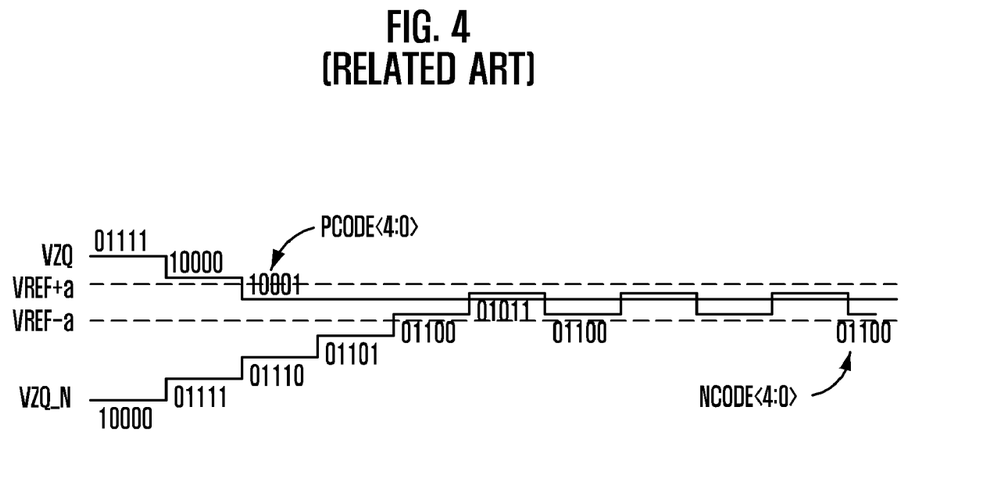
FIG. 4 is a timing diagram illustrating an operation of the conventional calibration circuit shown in FIG. 3.

FIG. 4 is a timing diagram illustrating an operation of the conventional calibration circuit, for instance, shown in FIG. 3. Referring to FIG. 4, for instance, when the value of PCODE<4:0> is increased gradationally during the pull-up calibration process, the resistance of the pull-up calibration resistance circuit 101 is increased gradationally so that the ZQ node voltage VZQ is gradationally decreased. As a result, when the ZQ node voltage VZQ enters the target range, the pull-up calibration process is completed.

At the following pull-down calibration process, when the value of NCODE<4:0> is decreased gradationally, the resistance of the pull-down calibration resistance circuit 105 is gradationally increased so that the pull-down calibration node voltage VZQ_N is gradationally increased. Therefore, the pull-down calibration is performed so that the pull-down calibration node voltage VZQ_N is equalized to the ZQ node voltage VZQ, i.e., the whole resistance of the pull-down calibration resistance circuit 105 is equalized to the whole resistance of the dummy calibration resistance circuit 103.

However, according to the conventional technology, although the calibration resistance and the termination resistance can be determined through the above-mentioned calibration process, an impedance mismatch may occur due to external environmental causes such as process and layout. In this case, the calibration resistance and the termination resistance need to be readjusted.

SUMMARY OF THE INVENTION

Embodiments of the present invention are directed to providing a calibration circuit, an on die termination device and a semiconductor memory device capable of readjusting a calibration resistance and a termination resistance by trimming a calibration code.

In accordance with an aspect of the present invention, there is provided a calibration circuit including a gain control device configured to adjust a reference voltage to a predetermined level according to a variable gain; and a calibration device configured to update a calibration code by comparing a voltage generated by a plurality of resistors and the reference voltage adjusted to the predetermined level by the gain control device, wherein the resistors are individually controlled to be turned on by the calibration code.

In accordance with another aspect of the present invention, there is provided an on die termination device including a gain control device configured to adjust a reference voltage to a predetermined level according to a variable gain; a calibration device configured to update a calibration code by comparing a voltage generated by a plurality of resistors and the reference voltage adjusted to the predetermined level by the gain control device, wherein the resistors are individually controlled to be turned on by the calibration code; and a termination resistance device configured to adjust a termination resistance in response to the updated calibration code.

In accordance with still another aspect of the present invention, there is provided a semiconductor memory device including a gain control device configured to adjust a reference voltage to a predetermined level according to a variable gain; and a calibration device configured to update a calibration code by comparing a voltage generated by a plurality of resistors and the reference voltage adjusted to the predetermined level by the gain control device, wherein the resistors are individually controlled to be turned on by the calibration code; and an output driver device configured to adjust a termination resistance in response to the updated calibration code.

DESCRIPTION OF SPECIFIC EMBODIMENTS

Other objects and advantages of the present invention can be understood by the following description, and become apparent with reference to the embodiments of the present invention.

Hereinafter, a calibration circuit in accordance with the present invention will be described in detail with reference to the accompanying drawings.

Figure 5:
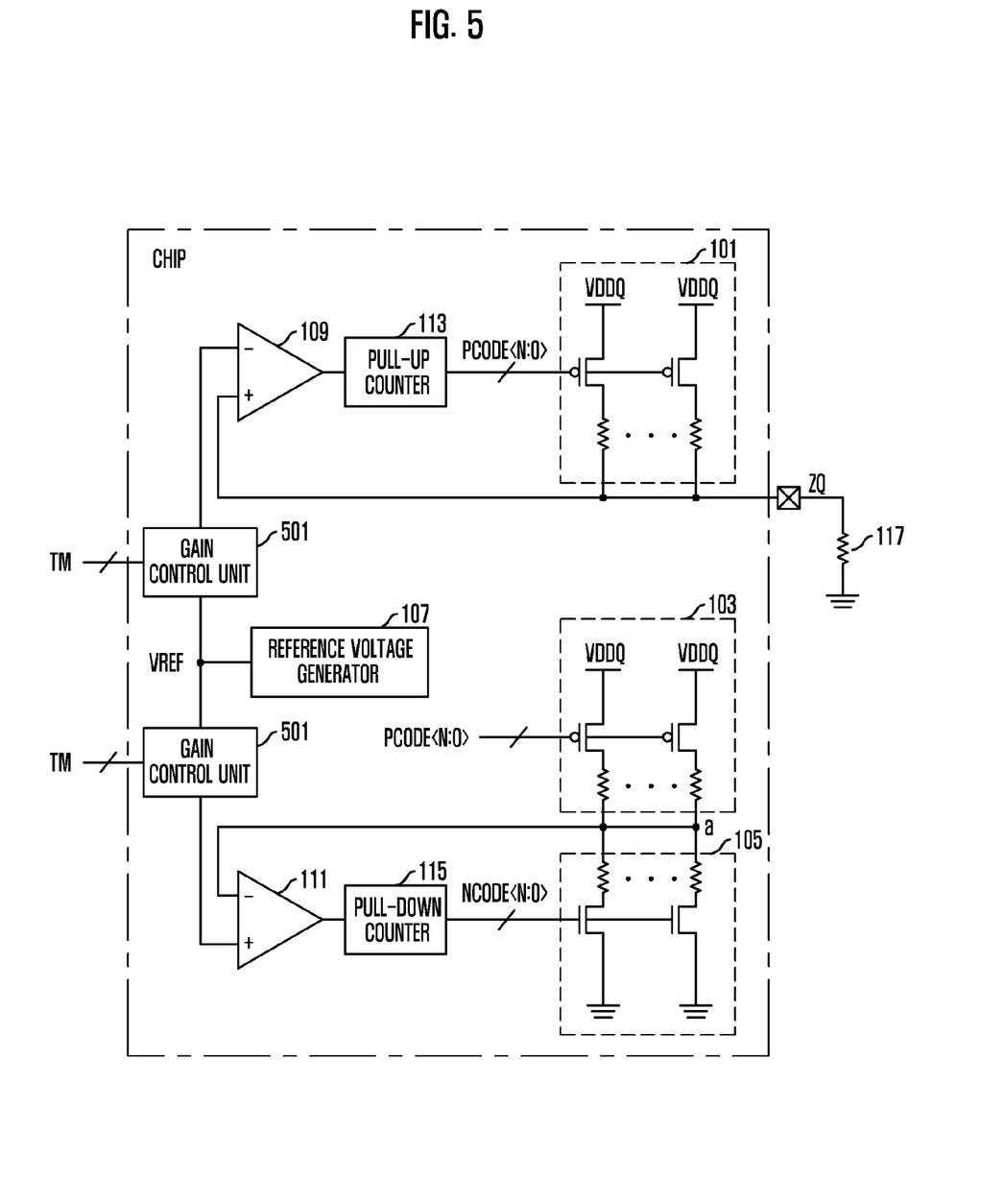
FIGS. 5 and 6 are schematic circuit diagrams depicting ZQ calibration circuits included in an on die termination device or a semiconductor memory device in accordance with an embodiment of the present invention.
Figure 6:
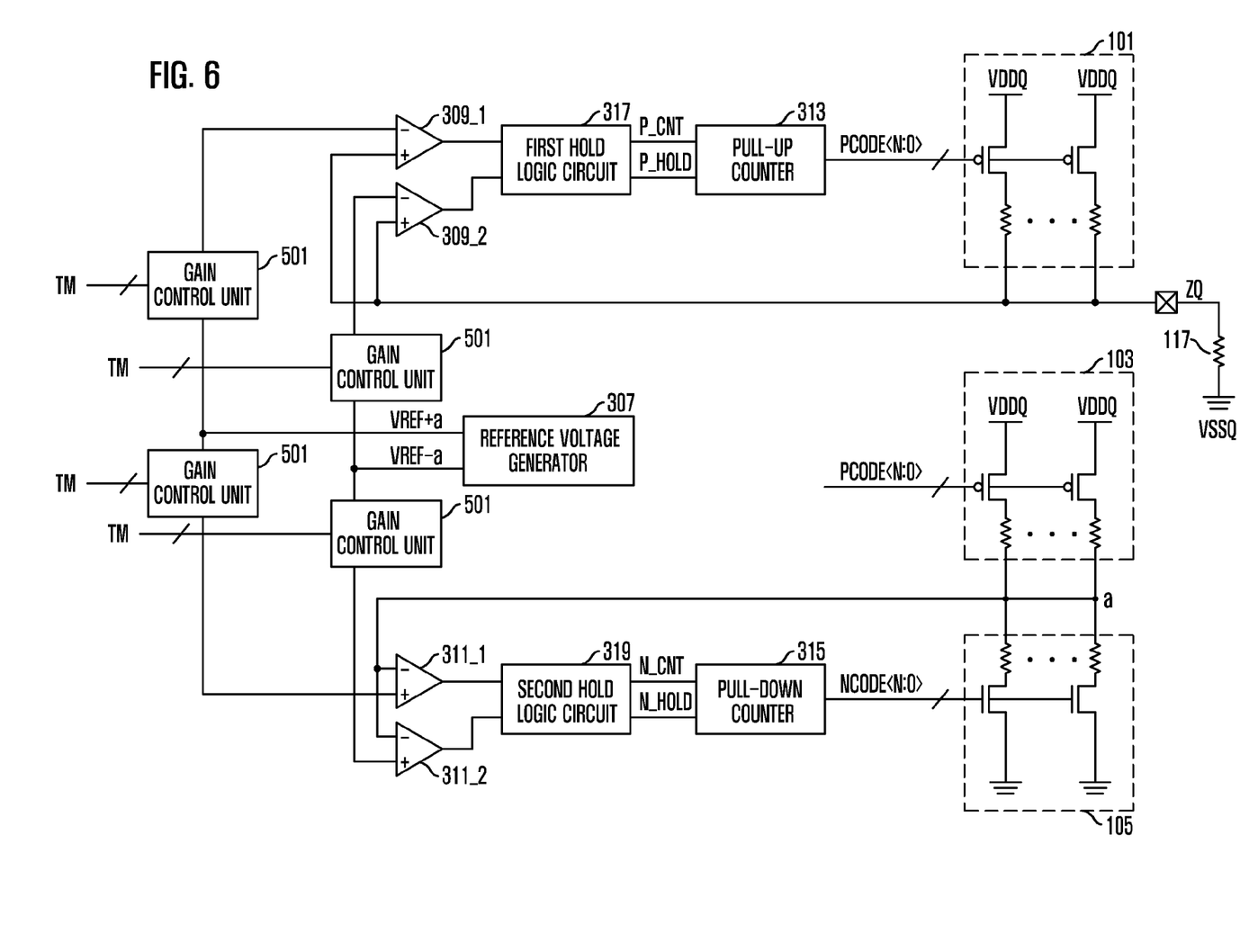

FIGS. 5 and 6 are schematic circuit diagrams depicting ZQ calibration circuits included in an on die termination device or a semiconductor memory device in accordance with an embodiment of the present invention.

FIGS. 5 and 6 respectively correspond to the calibration circuits shown in FIGS. 1 and 3. However, unlike the calibration circuits shown in FIGS. 1 and 3, voltage-level-adjusted reference voltages VREF, VREF+a and VREF−a or ZQ node voltages VZQ are used as input signals of comparators 109, 111, 309_1, 309_2, 311_1 and 311_2.

In accordance with the embodiments of the present invention, a gain control unit 501 is coupled to input terminals of the comparators 109, 111, 309_1, 309_2, 311_1 and 311_2 in order to adjust voltage levels of the reference voltages VREF, VREF+a and VREF−a and a voltage level of the ZQ node voltage VZQ. The gain control unit 501 outputs the reference voltages VREF, VREF+a and VREF−a and the ZQ node voltage VZQ whose voltage levels are increased or decreased in response to a gain control signal TM.

Herein, although the gain control unit 501 is connected to all of the comparators 109, 111, 309_1, 309_2, 311_1 and 311_2 as shown in FIGS. 5 and 6, the gain control unit 501 can be coupled to only one of a comparator group 109, 309_1 and 309_2 connected to the pull-up calibration resistance circuit 101 and a comparator group 111, 311_1 and 311_2 connected to the pull-down calibration resistance circuit 105.

Before explaining the gain control unit 501, a gain control circuit is described as follows.

Figure 7:
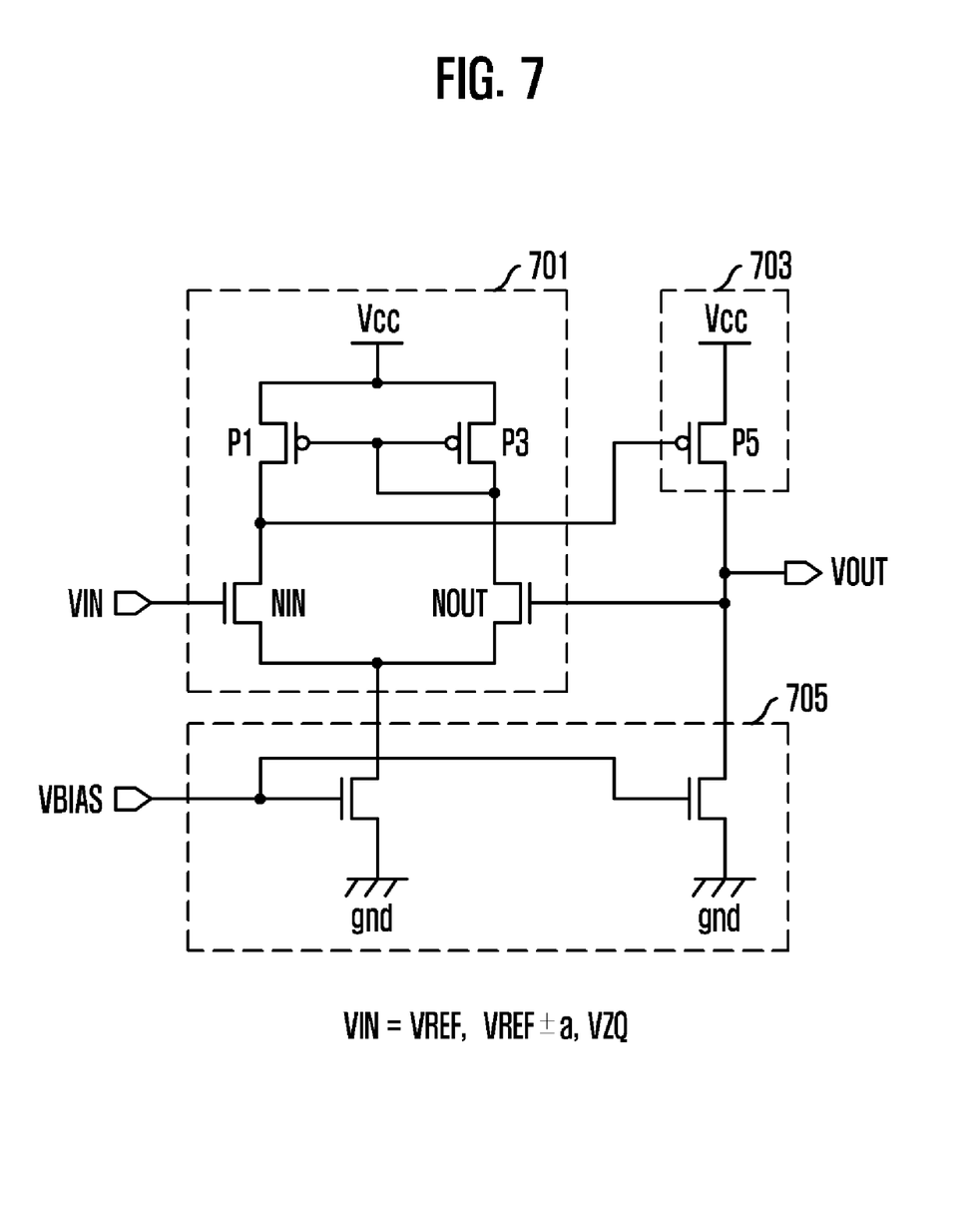
FIG. 7 is a schematic circuit diagram showing a gain control circuit.

FIG. 7 is a schematic circuit diagram showing the gain control circuit.

Referring to FIG. 7, the gain control circuit includes a comparison amplifying circuit 701 for generating a control signal in order to control the voltage level of an output signal voltage VOUT by comparing an input signal voltage VIN with the output signal voltage VOUT; and an output control circuit 703 for adjusting the voltage level of the output signal voltage VOUT in response to the control signal generated by the comparison amplifying circuit 701.

The comparison amplifying circuit 701 includes a first path having a p-type metal oxide semiconductor (PMOS) transistor P1 and an input n-type metal oxide semiconductor (NMOS) transistor NIN connected in series. A source node of the PMOS transistor P1 is connected to a power supply voltage VCC and a source node of the input NMOS transistor NIN is connected to a bias circuit 705.

The input signal voltage VIN is inputted to a gate node of the input NMOS transistor NIN. The comparison amplifying circuit 701 further includes a second path having a PMOS transistor P3 and an output NMOS transistor NOUT connected in series. A structure of the second path is similar to that of the first path. The output voltage VOUT is inputted to a gate node of the output NMOS transistor NOUT.

FIG. 7 shows a current mirror amplifier circuit as an embodiment of a comparison amplifying circuit. The input NMOS transistor NIN and the output NMOS transistor NOUT form a differential pair.

The output control circuit 703 includes a PMOS transistor P5 coupled to the power supply voltage VCC. A gate node of the PMOS transistor P5 is connected to a drain node of the input NMOS transistor NIN.

The bias circuit 705 controls on/off and bias of the comparison amplifying circuit 701 and the output control circuit 703 according to a bias signal VBIAS. The turned on state of the bias circuit 705 is described as follows.

For instance, when the input signal voltage VIN is higher than the output signal voltage VOUT, a drain node of the NMOS transistor NIN is pulled-down. Therefore, the PMOS transistor P5 is turned on and the output signal voltage VOUT is increased.

Meanwhile, when the input signal voltage VIN is lower than the output signal voltage VOUT, the output NMOS transistor NOUT is turned on and thus, a drain node of the output NMOS transistor NOUT is pulled-down. Accordingly, the PMOS transistors P1 and P3 coupled to the power supply voltage VCC are turned on so that a drain node of the input NMOS transistor NIN is pulled-up. Therefore, the PMOS transistor P5 is turned off and thus, the output signal voltage VOUT is decreased.

The gain control circuit keeps the voltage level of the output signal voltage VOUT by continuously comparing the input signal voltage VIN and the output signal voltage VOUT as above-mentioned.

Herein, when characteristics of the transistors P1, P3, NIN and NOUT included in the comparison amplifying circuit 701 are all the same, the gain of the gain control circuit is 1. Accordingly, the output control circuit 703 keeps the input signal voltage VIN and output signal voltage VOUT to have the same voltage level. A gain control circuit whose gain is 1 is called a unit gain buffer.

On the other hand, when the characteristic of the input NMOS transistor NIN supplied with the input signal voltage VIN is smaller or larger than that of the output NMOS transistor NOUT supplied with the output signal voltage VOUT, the gain of the gain control unit is smaller or larger than 1 respectively. Therefore, the output signal voltage VOUT becomes smaller or larger than the input signal voltage respectively.

In accordance with the embodiment of the present invention, the gain control unit 501 is adopted in order to control the gain, i.e., the voltage level of the output signal voltage VOUT, by controlling characteristics of the input NMOS transistor NIN and the output NMOS transistor NOUT shown in FIG. 7.

Figure 8:
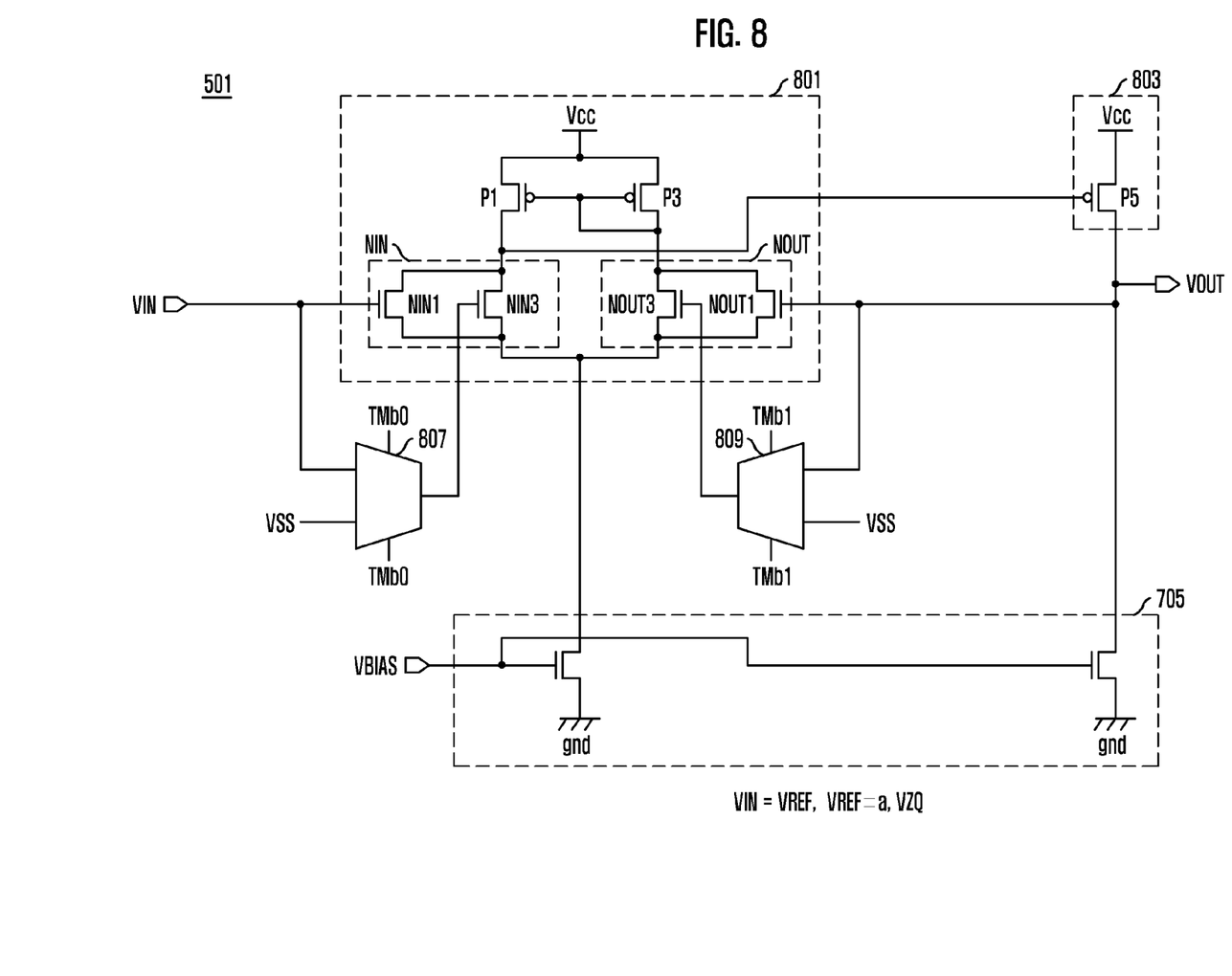
FIG. 8 is a schematic circuit diagram depicting the gain control unit shown in FIGS. 5 and 6.

FIG. 8 is a detailed circuit diagram depicting the gain control unit 501 shown in FIGS. 5 and 6. A structure of the gain control unit 501 shown in FIG. 8 is similar to that of the gain control circuit shown in FIG. 7.

However, unlike the gain control circuit shown in FIG. 7, for constructing the comparison amplifying circuit, the input NMOS transistor circuit NIN includes a plurality of NMOS transistors (NIN1, NIN3) connected in parallel and the output NMOS transistor circuit NOUT includes a plurality of NMOS transistors (NOUT1, NOUT3) connected in parallel. Further, control circuits 807 and 809 are additionally included in the gain control unit 501.

Considering FIGS. 5 and 6, the input signal voltage VIN inputted to the gain control unit 501 can be the reference voltages VREF, VREF+a and VREF−a or the ZQ node voltage VZQ.

Referring to FIG. 8, each of the input NMOS transistor circuit NIN and the output NMOS transistor circuit NOUT includes a single main transistor (NIN1, NOUT1) and a single additional transistor (NIN3, NOUT3). For instance, the plurality of NMOS transistors included in the input NMOS transistor circuit NIN may have a single main transistor (NIN1) and additional transistors (NIN3).

The input signal voltage VIN is inputted to a gate node of the main transistor NIN1. Based on a gain control signal TM0, the input signal voltage VIN is selectively inputted to a gate node of the additional transistor NIN3. Meanwhile, the plurality of NMOS transistors included in the output NMOS transistor circuit may have a single main transistor (NOUT1) and additional transistors (NOUT3).

The output signal voltage VOUT is inputted to a gate of the main transistor NOUT1. Based on a gain control signal TM1, the output signal voltage VOUT is selectively inputted to a gate node of the additional transistor NOUT3.

Herein, characteristics of the main transistors NIN1 and NOUT1 are all the same. Further, the whole characteristic of the input NMOS transistor circuit NIN is the same to that of the output NMOS transistor circuit NOUT. According to this structure, when all the additional transistors NIN3 and NOUT3 are turned on or off, the characteristic of the input NMOS transistor circuit NIN is equal to that of the output NMOS transistor circuit NOUT so that the gain control unit 501 is operated as a unit gain buffer.

However, it is well known to those skilled in the art that the number of the additional transistors included in the input NMOS transistor circuit NIN and the output NMOS transistor circuit NOUT and each characteristic of the additional transistors can be changed according to a voltage level adjustment resolution and a level variation amount of the reference voltages VREF, VREF+a and VREF−a or the ZQ node voltage VZQ. For instance, the number of the additional transistors may relate to the voltage level adjustment resolution and the characteristic of the additional transistor may relate to the level variation amount.

The gain control unit 501 includes the control circuits 807 and 809 in order to control the turning off of the addition transistors NIN3 and NOUT3 included in the input NMOS transistor circuit NIN and the output NMOS transistor NOUT. FIG. 8 illustrates the control circuit as a MUX form in accordance with the embodiments of the present invention.

The control circuits 807 and 809 respectively controls the turning off of the additional transistors NIN3 and NOUT3 based on the gain control signals TM0 and TM1. A structure of the control circuit 807 coupled to the input NMOS transistor circuit NIN is similar to that of the control circuit 809 coupled to the output NMOS transistor circuit NOUT.

For instance, the control circuit 807 coupled to the input NMOS transistor circuit NIN selectively supplies the input signal voltage VIN and a ground voltage VSS to a gate node of the additional transistor NIN3 based on the gain control signal TM0. Similarly, the control circuit 809 coupled to the output NMOS transistor circuit NOUT selectively supplies the output signal voltage VOUT and the ground voltage VSS to a gate node of the additional transistor NOUT3.

When the ground voltage VSS is inputted to a gate node of the additional transistor (NIN3, NOUT3), the additional transistor (NIN3, NOUT3) is turned off. The characteristic of the input NMOS transistor NIN or the output NMOS transistor NOUT is changed whether the additional transistor (NIN3, NOUT3) is turned off or not.

For instance, referring to FIG. 8, when only the additional transistor NIN3 of the input NMOS transistor circuit NIN is turned off, the characteristic of the input NMOS transistor circuit NIN is smaller than that of the output NMOS transistor circuit NOUT. Accordingly, the gain of the gain control unit 501 becomes smaller than 1 so that the output signal voltage VOUT becomes smaller than the input signal voltage VIN. On the other hand, when only the additional transistor NOUT3 of the output NMOS transistor circuit NOUT is turned off, the characteristic of the input NMOS transistor circuit NIN is larger than that of the output NMOS transistor circuit NOUT. Accordingly, the gain of the gain control unit 501 becomes larger than 1 so that the output signal voltage VOUT becomes larger than the input signal voltage VIN.

Although the gain control unit 501 includes a single control unit 807 or 809 for controlling a corresponding single additional transistor (NIN3 or NOUT3), the gain control unit 501 can have a plurality of additional transistors. In this case, the gain control unit 501 can have a plurality of control units corresponding to the plurality of additional transistors.

The control circuits 807 and 809 can be constructed with a transmission gate.

Figure 9:
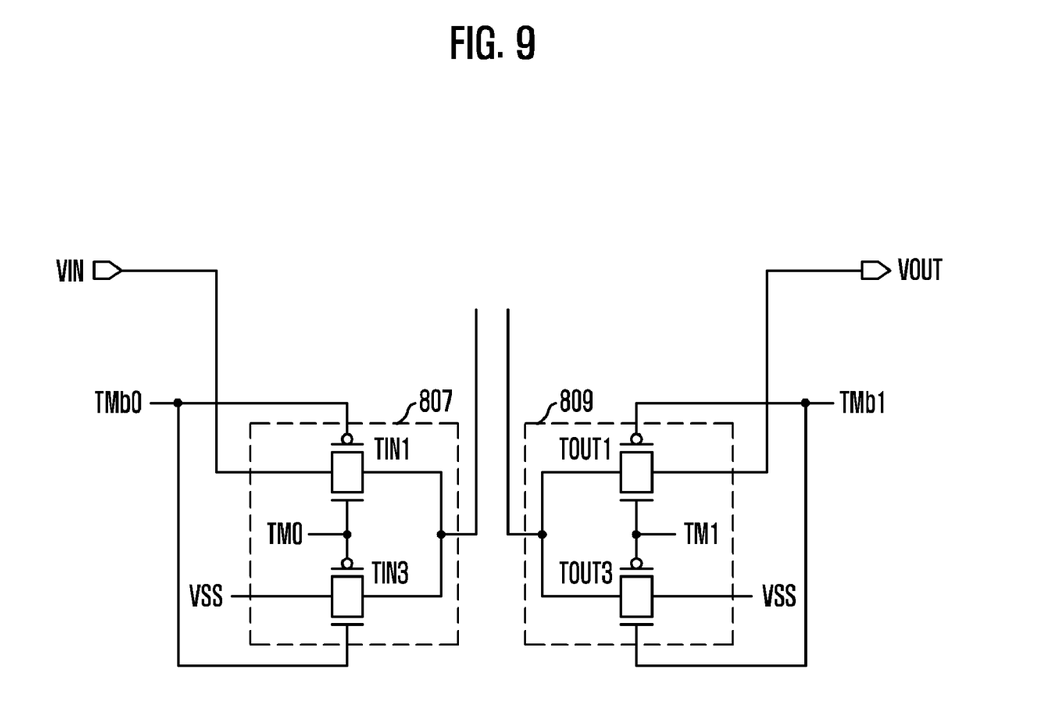
FIG. 9 is a schematic circuit diagram showing the control circuits shown in FIG. 8.

FIG. 9 is a detailed circuit diagram showing the control circuits 807 and 809 in accordance with the embodiment of the present invention.

Referring to FIG. 9, the control circuit 807 includes two transmission gates TIN1 and TIN3, wherein one of the transmission gates TIN1 and TIN3 is turned on and the other is turned off in response to the gain control signal TM0. The transmission gates TIN1 and TIN3 respectively transfer the input signal voltage VIN and the ground voltage VSS to a gate of the additional transistor NIN3.

Similarly, the control circuit 809 includes two transmission gates TOUT1 and TOUT3, wherein one of the transmission gates TOUT1 and TOUT3 is turned on and the other is turned off in response to the gain control signal TM1. The transmission gates TOUT1 and TOUT3 respectively transfer the output signal voltage VOUT and the ground voltage VSS to a gate of the additional transistor NOUT3.

Therefore, the control circuits 807 and 809 controls the turning off of the additional transistors NIN3 and NOUT3 based on the gain control signals TM0 and TM1. According to whether the additional transistors NIN3 and NOUT3 are turned off or not, the characteristic of the input NMOS transistor circuit NIN or the output NMOS transistor circuit NOUT is changed so that the gain of the gain control unit 501 is changed. As a result, the voltage level of the reference voltages VREF, VREF+a and VREF−a or the ZQ node voltage VZQ is adjusted.

The voltage adjustment of the reference voltage VREF, VREF+a and VREF−a or the ZQ node voltage VZQ cause trimming of the calibration codes, i.e., the PCODE and the NCODE.

An operation of the ZQ calibration circuit included in the on die termination device or the semiconductor memory device in accordance with the embodiment of the present invention is described below.

Figure 10:
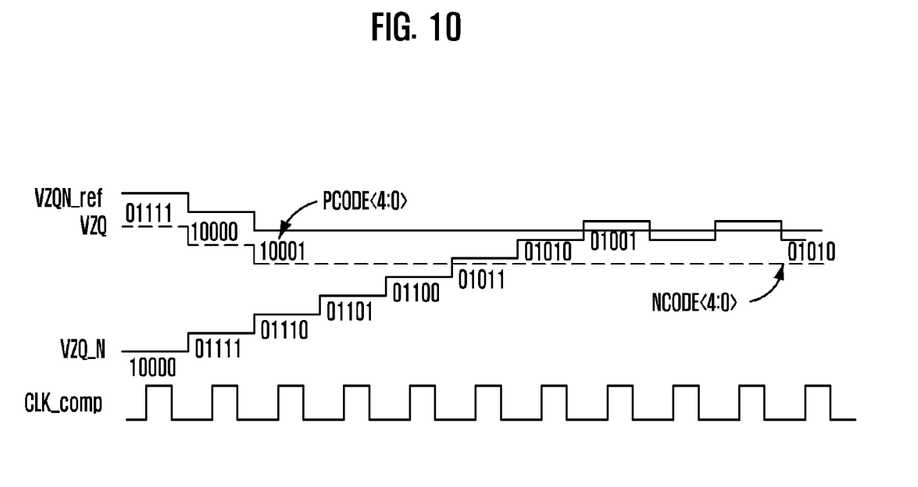
FIG. 10 is a timing diagram showing an operation when the ZQ node voltage VZQ is increased by the gain control unit.
Figure 11:
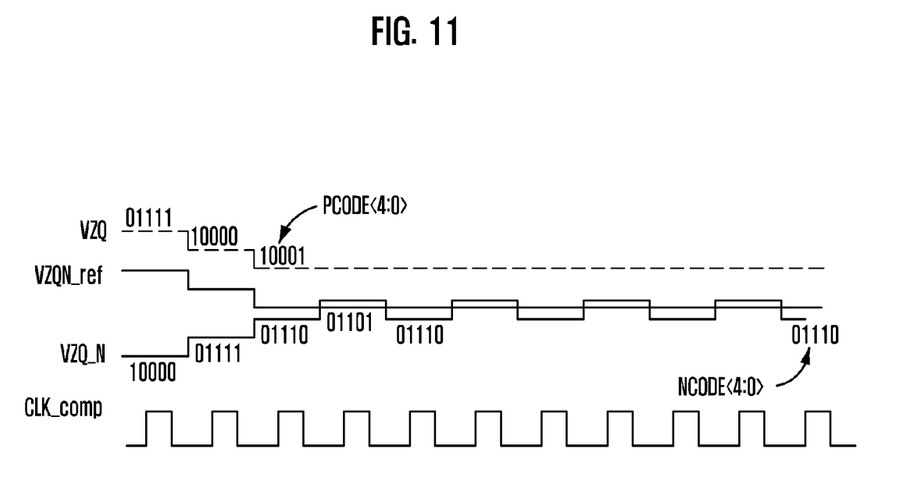
FIG. 11 is a timing diagram showing an operation when the ZQ node voltage VZQ is decreased by the gain control unit.

FIGS. 10 and 11 are timing diagrams depicting a pull-down calibration operation in accordance with the embodiment of the present invention. FIG. 10 is a timing diagram showing an operation when the ZQ node voltage VZQ is increased by the gain control unit 501 and FIG. 11 is a timing diagram showing an operation when the ZQ node voltage VZQ is decreased by the gain control unit 501.

Herein, FIGS. 10 and 11 are timing diagrams in accordance with one embodiment where the gain control unit 501 is coupled only to comparators 111, 311_1 and 311_2 connected to the pull-down calibration resistance circuit 105. Further, FIGS. 10 and 11 are timing diagrams in accordance with one embodiment where the ZQ node voltage VZQ is used as an input signal of the comparators 111, 311_1 and 311_2.

The pull-up calibration operation is performed in the same manner as shown in FIG. 4 so that the resistance of the pull-up calibration resistance circuit 101 and the value of the PCODE<4:0> are determined. However, when the pull-down calibration resistance and the termination resistance need to be readjusted due to an impedance mismatch caused by external environment such as a process and a layout, the gain control signals TM0 and TM1 are generated.

According to the gain control signals TM0 and TM1, as shown in FIG. 8, the control circuits 807 and 809 included in the gain control unit 501 control the turning off of the additional transistors NIN3 and NOUT3 so that the characteristic of the input NMOS transistor circuit NIN or the output NMOS transistor circuit NOUT is changed. Then, according to the characteristic change of the input NMOS transistor circuit NIN or the output NMOS transistor circuit NOUT, the gain of the gain control unit 501 is changed so that the voltage level of the ZQ node voltage VZQ is adjusted.

For instance, referring to FIG. 10, the gain control signals TM0 and TM1 are respectively 1 and 0 and thus, the characteristic of the input NMOS transistor circuit NIN is larger than that of the output NMOS transistor circuit NOUT so that the gain of the gain control unit 501 is larger than 1. As a result, an output signal voltage (VZQN_REF) of the gain control unit 501 is kept higher than the ZQ node voltage VZQ.

Therefore, when the pull-down calibration operation is performed according to the output signal voltage VZQN_REF upward-adjusted from the ZQ node voltage VZQ, a downward-adjusted NCODE is generated and the resistance of the pull-down calibration resistance circuit 105 is upward-adjusted unlike the related art shown in FIG. 4. In other words, the calibration code is trimmed in order to readjust the calibration resistance.

Comparing FIG. 4 with FIG. 10, the same PCODE, i.e., PCODE of <10001>, is generated by the pull-up calibration operation. However, different NCODEs, i.e., NCODEs of <01100> and <01010>, are generated by the pull-down calibration operation.

Referring to FIG. 11, the gain control signal TM0 and TM1 are respectively 0 and 1 and thus, the characteristic of the input NMOS transistor circuit NIN is smaller than that of the output NMOS transistor circuit NOUT so that the gain of the gain control unit 501 is smaller than 1. As a result, the output signal voltage VZQN_REF of the gain control unit 501 is kept lower than the ZQ node voltage VZQ.

Therefore, when the pull-down calibration operation is performed according to the output signal voltage VZQN_REF downward-adjusted from the ZQ node voltage VZQ, an upward-adjusted NCODE is generated and the resistance of the pull-down calibration resistance circuit 105 is downward-adjusted unlike the related art shown in FIG. 4. In other words, the calibration code is trimmed in order to readjust the calibration resistance.

Comparing FIG. 4 with FIG. 11, the same PCODE, i.e., PCODE of <10001>, is generated by the pull-up calibration operation. However, different NCODEs, i.e., NCODEs of <01100> and <01110>, are generated by the pull-down calibration operation.

The above-mentioned calibration result influences the termination resistance circuit so that the termination resistance is also adjusted.

Although the present invention has been described focusing on the calibration circuit and the termination resistance circuit as one embodiment, the present invention can be embodied in the on die termination device and the semiconductor memory device as another embodiment.

Embodiments of the present invention relate to a calibration circuit capable of readjusting a calibration resistance and a termination resistance by trimming a calibration code.

While the present invention has been described with respect to the specific embodiments, it will be apparent to those skilled in the art that various changes and modifications may be made without departing from the spirit and scope of the invention as defined in the following claims.

What is claimed is:

1. A calibration circuit, comprising:
a gain control device configured to receive a gain control signal and to adjust a reference voltage to a predetermined level in response to the gain control signal; and
a calibration device configured to update a calibration code by comparing a voltage generated according to a plurality of resistors with the reference voltage adjusted to the predetermined level by the gain control device, wherein each of the plurality of resistors is individually controlled to be turned on according to the calibration code,
wherein the gain control device includes:
a comparison amplifying unit configured to generate a control signal for adjusting a level of the output voltage according to a result of a comparison between the reference voltage and an output voltage;
an output adjustment unit configured to adjust the level of the output voltage based on the control signal of the comparison amplifying unit; and
a control unit configured to select one of the reference voltage and a ground voltage and transfer the selected voltage and select one of the output voltage and the ground voltage and transfer the selected one of the output voltage and the ground voltage to the comparison amplifying unit in response to a characteristic control signal.

2. The calibration circuit of claim 1, wherein the comparison amplifying unit is provided with a differential pair of transistor circuits, and a characteristic of the differential pair of the transistor circuits is changed according to the characteristic control signal.

3. The calibration circuit of claim 2, wherein the output adjustment unit increases the output voltage when a level of the reference voltage is higher than that of the output voltage and decreases the output voltage when a level of the reference voltage is lower than that of the output voltage based on the gain control signal of the comparison amplifying unit.

4. The calibration circuit of claim 2, wherein the differential pair of transistor circuits includes:
   an input transistor circuit configured to generate the control signal for adjusting the level of the output voltage, wherein the input transistor circuit is turned on by the reference voltage with a level higher than the output voltage and a characteristic of the input transistor circuit is changed according to the characteristic control signal; and
   an output transistor circuit which is turned on by the output voltage with a level higher than the reference voltage, wherein a characteristic of the output transistor circuit is changed according to the characteristic control signal.

5. The calibration circuit of claim 4, wherein the input transistor circuit includes:
   a main input transistor turned on by the reference voltage with a level higher than the output voltage; and
   at least one additional input transistor coupled to the main input transistor in parallel therewith, wherein the additional input transistor is turned on by the reference voltage with a level higher than the output voltage or turned off by the characteristic control signal.

6. The calibration circuit of claim 5, wherein the control unit is a multiplexer for selectively transferring one of the reference voltage and the characteristic control signal to the additional input transistor.

7. The calibration circuit of claim 4, wherein the output transistor circuit includes:
   a main output transistor turned on by the output voltage with a level higher than the reference voltage; and
   at least one additional output transistor coupled to the main output transistor in parallel therewith, wherein the additional output transistor is turned on by the output voltage with a level higher than the reference voltage or turned off by the characteristic control signal.

8. The calibration circuit of claim 7, wherein the input transistor circuit includes:
   a main input transistor turned on by the reference voltage higher than the output voltage, wherein a characteristic of the main output transistor is equal to that of the main input transistor; and
   at least one additional input transistor coupled to the main input transistor in parallel therewith, wherein the additional input transistor is turned on by the reference voltage higher than the output voltage or turned off by the characteristic control signal and a whole characteristic of the at least one additional output transistor is equal to that of the at least one additional input transistor.

9. The calibration circuit of claim 7, wherein the control unit is a multiplexer for selectively transferring one of the output voltage and the characteristic control signal to the additional output transistor.

10. The calibration circuit of claim 1, wherein the gain control device further includes a bias unit for controlling the turning on/off and a bias of at least one of the comparison amplifying unit and the output adjustment unit according to a bias signal.

11. The calibration circuit of claim 1, wherein the comparison amplifying unit is a current mirror type amplifier.

12. The calibration circuit of claim 1, wherein the calibration device is a pull-down calibration device and the reference voltage is a ZQ node voltage.

13. The calibration circuit of claim 1, wherein the calibration device is a pull-up calibration device.

14. The calibration circuit of claim 1, wherein the calibration device is a pull-down calibration device.

15. An on die termination device, comprising:
   a gain control device configured to receive a gain control signal and to adjust a reference voltage to a predetermined level in response to the gain control signal;
   a calibration device configured to update a calibration code by comparing a voltage generated according to a plurality of resistors with the reference voltage adjusted to the predetermined level by the gain control device, wherein each of the plurality of resistors is individually controlled to be turned on by the calibration code; and
   a termination resistance device configured to adjust a termination resistance in response to the updated calibration code,
   wherein the gain control device includes:
      a comparison amplifying unit configured to generate a control signal for adjusting a level of the output voltage according to a result of a comparison between the reference voltage and an output voltage;
      an output adjustment unit configured to adjust the level of the output voltage based on the control signal of the comparison amplifying unit; and
      a control unit configured to select one of first and second voltages and transfer the selected voltage and select one of the output voltage and the ground voltage and transfer the selected one of the output voltage and the ground voltage to the comparison amplifying unit in response to a characteristic control signal.

16. The on die termination device of claim 15, wherein the comparison amplifying unit is provided with a differential pair of transistor circuits, and a characteristic of the differential pair of the transistor circuits is changed according to the characteristic control signal.

17. The on die termination device of claim 16, wherein the differential pair of the transistor circuits includes:
   an input transistor circuit configured to generate the control signal for adjusting the level of the output voltage, wherein the input transistor circuit is turned on by the reference voltage with a level higher than the output voltage and a characteristic of the input transistor circuit is changed according to the characteristic control signal; and
   an output transistor circuit which is turned on by the output voltage with a level higher than the reference voltage, wherein a characteristic of the output transistor circuit is changed according to the characteristic control signal.

18. The on die termination device of claim 17, wherein the input transistor circuit includes:
   a main input transistor turned on by the reference voltage with a level higher than the output voltage; and
   at least one additional input transistor coupled to the main input transistor in parallel, wherein the additional input transistor is turned on by the reference voltage with a level higher than the output voltage or turned off by the characteristic control signal.

19. The on die termination device of claim 18, wherein the output transistor circuit includes:
- a main output transistor turned on by the output voltage with a level higher than the reference voltage; and
- at least one additional output transistor coupled to the main output transistor in parallel, wherein the additional output transistor is turned on by the output voltage with a level higher than the reference voltage or turned off by the characteristic control signal and a whole characteristic of the at least one additional output transistor is equal to that of the at least one additional input transistor.

20. The on die termination device of claim 16, wherein the output adjustment unit increases the output voltage when a level of the reference voltage is higher than that of the output voltage and decreases the output voltage when a level of the reference voltage is lower than that of the output voltage based on the control signal of the comparison amplifying unit.

21. A semiconductor memory device, comprising:
- a gain control device configured to receive a gain control signal and to adjust a reference voltage to a predetermined level in response to the gain control signal; and
- a calibration device configured to update a calibration code by comparing a voltage generated by a plurality of resistors and the reference voltage adjusted to the predetermined level by the gain control device, wherein the resistors are individually controlled to be turned on by the calibration code; and
- an output driver device configured to adjust a termination resistance in response to the updated calibration code, wherein the gain control device includes:
- a comparison amplifying unit configured to generate a control signal for adjusting a level of the output voltage according to a comparison result between the reference voltage and an output voltage;
- an output adjustment unit configured to adjust the level of the output voltage based on the control signal of the comparison amplifying unit; and
- a control unit configured to select one of first and second voltages and transfer the selected voltage and select one of the output voltage and the ground voltage and transfer the selected one of the output voltage and the ground voltage to the comparison amplifying unit in response to a characteristic control signal.

22. The semiconductor memory device of claim 21, wherein the comparison amplifying unit is provided with a differential pair of transistor circuits, and a characteristic of the differential pair of the transistor circuits is changed according to the characteristic control signal.

23. The semiconductor memory device of claim 22, wherein the differential pair of transistor circuits includes:
- an input transistor circuit configured to generate the control signal for adjusting the level of the output voltage, wherein the input transistor circuit is turned on by the reference voltage with a level higher than the output voltage and a characteristic of the input transistor circuit is changed according to the characteristic control signal; and
- an output transistor circuit which is turned on by the output voltage with a level higher than the reference voltage, wherein a characteristic of the output transistor circuit is changed according to the characteristic control signal.

24. The semiconductor memory device of claim 23, wherein the input transistor circuit includes:
- a main input transistor turned on by the reference voltage with a level higher than the output voltage; and
- at least one additional input transistor coupled to the main input transistor in parallel therewith, wherein the additional input transistor is turned on by the reference voltage with a level higher than the output voltage or turned off by the characteristic control signal.

25. The semiconductor memory device of claim 24, wherein the output transistor circuit includes:
- a main output transistor turned on by the output voltage with a level higher than the reference voltage; and
- at least one additional output transistor coupled to the main output transistor in parallel therewith, wherein the additional output transistor is turned on by the output voltage with a level higher than the reference voltage or turned off by the characteristic control signal and a whole characteristic of the at least one additional output transistor is equal to that of the at least one additional input transistor.

26. The semiconductor memory device of claim 22, wherein the output adjustment unit increases the output voltage when a level of the reference voltage is higher than that of the output voltage and decreases the output voltage when a level of the reference voltage is lower than that of the output voltage based on the control signal of the comparison amplifying unit.

* * * * *

UNITED STATES PATENT AND TRADEMARK OFFICE
CERTIFICATE OF CORRECTION

PATENT NO. : 7,859,296 B2  
APPLICATION NO. : 12/326772  
DATED : December 28, 2010  
INVENTOR(S) : Mi-Hye Kim et al.

Page 1 of 1

It is certified that error appears in the above-identified patent and that said Letters Patent is hereby corrected as shown below:

Title Page  
Change FOREIGN PATENT DOCUMENTS portion of section (56) for References Cited as follows:

FOREIGN PATENT DOCUMENTS

KR  1020070116363 A  12/2007  
KR  1020080092509 A  10/2008

Signed and Sealed this  
Twenty-second Day of February, 2011

David J. Kappos  
*Director of the United States Patent and Trademark Office*